(12) United States Patent
Hirasawa et al.

(10) Patent No.: US 7,503,451 B2
(45) Date of Patent: Mar. 17, 2009

(54) CONVEYING APPARATUS

(75) Inventors: Yoichi Hirasawa, Tokyo (JP); Tetsuya Kimura, Tokyo (JP)

(73) Assignee: Hirata Corporation, Shinagawa-Ku, Tokyo (JP)

( * ) Notice: Subject to any disclaimer, the term of this patent is extended or adjusted under 35 U.S.C. 154(b) by 0 days.

(21) Appl. No.: 11/632,054

(22) PCT Filed: Jul. 22, 2004

(86) PCT No.: PCT/JP2004/010419

§ 371 (c)(1),
(2), (4) Date: Jan. 10, 2007

(87) PCT Pub. No.: WO2006/008818

PCT Pub. Date: Jan. 26, 2006

(65) Prior Publication Data

US 2007/0261938 A1   Nov. 15, 2007

(51) Int. Cl.
*B65G 13/07* (2006.01)
(52) U.S. Cl. .................. 198/790; 198/780; 198/785; 198/369.1
(58) Field of Classification Search .......... 198/624, 198/790, 785, 369.1, 780
See application file for complete search history.

(56) References Cited

U.S. PATENT DOCUMENTS

| | | | | |
|---|---|---|---|---|
| 5,105,935 A | * | 4/1992 | Kohl | 198/781.08 |
| 5,392,899 A | * | 2/1995 | Wakabayashi | 198/780 |
| 6,220,420 B1 | * | 4/2001 | Jan et al. | 198/369.1 |
| 6,223,888 B1 | * | 5/2001 | Jahns | 198/781.03 |
| 6,494,308 B2 | * | 12/2002 | Bonora et al. | 198/465.2 |
| 6,572,321 B1 | * | 6/2003 | Nulman | 414/416.05 |
| 7,175,018 B2 | * | 2/2007 | Helgerson et al. | 198/780 |

(Continued)

FOREIGN PATENT DOCUMENTS

JP   1974/22680   2/1974

(Continued)

OTHER PUBLICATIONS

International Search Report and Written Opinion.

*Primary Examiner*—Mark A Deuble
(74) *Attorney, Agent, or Firm*—Buchanan Ingersoll & Rooney PC (57) ABSTRACT

It is an object of the present invention to provide a conveying apparatus which guides a conveying target object in the conveying direction while preventing it from falling off from rollers and in which intervals between the adjacent rollers can be narrowed. The present invention is a conveying apparatus comprising a plurality of rollers which are arranged in a conveying direction of a conveying target object and on which the conveying target object is to be placed, wherein the plurality of rollers include a first roller and a second roller adjacent to the first roller, the first roller comprises a first placement portion on which the conveying target object is to be placed, and a large diameter portion which has a larger diameter than that of the first placement portion and guides the conveying target object in the conveying direction, and the second roller comprises a second placement portion on which the conveying target object is to be placed, and a small diameter portion which has a smaller diameter than that of the second placement portion and prevents interference between the large diameter portion and the second roller.

14 Claims, 12 Drawing Sheets

U.S. PATENT DOCUMENTS

2005/0269184 A1 * 12/2005 Enya ................. 198/369.2
2006/0151297 A1 * 7/2006 Pyke et al. ............. 198/780

FOREIGN PATENT DOCUMENTS

| | | | | |
|---|---|---|---|---|
| JP | 62269804 A | * | 11/1987 | ........ 198/624 |
| JP | 63097513 A | * | 4/1988 | ........ 198/790 |
| JP | 7-117824 A | | 5/1995 | |
| JP | 11-165844 A | | 6/1999 | |
| JP | 2002-534800 A | | 10/2002 | |
| JP | 2002-321805 A | | 11/2002 | |
| JP | 2003-524544 A | | 8/2003 | |
| JP | 2004-115194 A | | 4/2004 | |

* cited by examiner

CONVEYING APPARATUS

TECHNICAL FIELD

The present invention relates to a conveying apparatus using rollers and, more particularly, to a conveying apparatus suitable to convey a container which accommodates a semiconductor wafer in a clean room or the like.

BACKGROUND ART

As a conveying apparatus conveying a container which accommodates a semiconductor wafer in a clean room or the like, a conveyor type conveying apparatus which uses a plurality of rollers is known. For example, Japanese Patent Application Laid-Open No. 2002-534800 proposes a conveying apparatus in which a plurality of rollers comprising driving rollers and running rollers are arranged in two rows in the conveying direction. Japanese Patent Application Laid-Open No. 2003-524544 proposes a conveying apparatus comprising a driving rail on which a plurality of rollers are arrayed in the conveying direction and a support rail which is arranged substantially parallel to the driving rail.

If the intervals between adjacent rollers are large, several problems arise. First, a conveying target object tends to vibrate vertically. Dust produced by a driving mechanism which drives the rollers readily passes through the rollers to diffuse in a clean room. Therefore, plates that block the gaps between the adjacent rollers must be arranged, as described in Japanese Patent Application Laid-Open No. 2003-524544. Accordingly, the narrower the intervals between the adjacent rollers, the better.

Also, each roller is desirably provided with a portion which guides the conveying target object so as not to fall off from the rollers. For example, the running roller of Japanese Patent Application Laid-Open No. 2002-534800 has a large diameter taper at its end to guide the conveying target object to the center of the roller. However, to form such a taper, the intervals between the adjacent rollers tend to increase.

DISCLOSURE OF INVENTION

It is an object of the present invention to provide a conveying apparatus which guides a conveying target object in the conveying direction while preventing it from falling off from rollers and in which intervals between the adjacent rollers can be narrowed.

According to the present invention, there is provided a conveying apparatus comprising a plurality of rollers which are arranged in a conveying direction of a conveying target object and on which the conveying target object is to be placed, wherein the plurality of rollers include a first roller and a second roller adjacent to the first roller, the first roller comprises a first placement portion on which the conveying target object is to be placed, and a large diameter portion which has a larger diameter than that of the first placement portion and guides the conveying target object in the conveying direction, and the second roller comprises a second placement portion on which the conveying target object is to be placed, and a small diameter portion which has a smaller diameter than that of the second placement portion and prevents interference between the large diameter portion and the second roller.

According to this conveying apparatus, as the first roller has the large diameter portion, it can guide the conveying target object in the conveying direction while preventing it from falling off from the rollers. As the second roller has the small diameter portion, the first and second rollers can be arranged closely to be in noncontact with each other, to narrow the intervals between the adjacent rollers. The narrow intervals between the adjacent rollers can suppress vertical vibration of the conveying target object. Also, a seal is formed between the adjacent rollers to prevent dust produced by a driving mechanism which drives the rollers or the like from passing through the rollers to diffuse around.

BRIEF DESCRIPTION OF DRAWINGS

FIG. 4A is a view showing the outer appearance of a roller 101a;

BEST MODE FOR CARRYING OUT THE INVENTION

Figure 1:
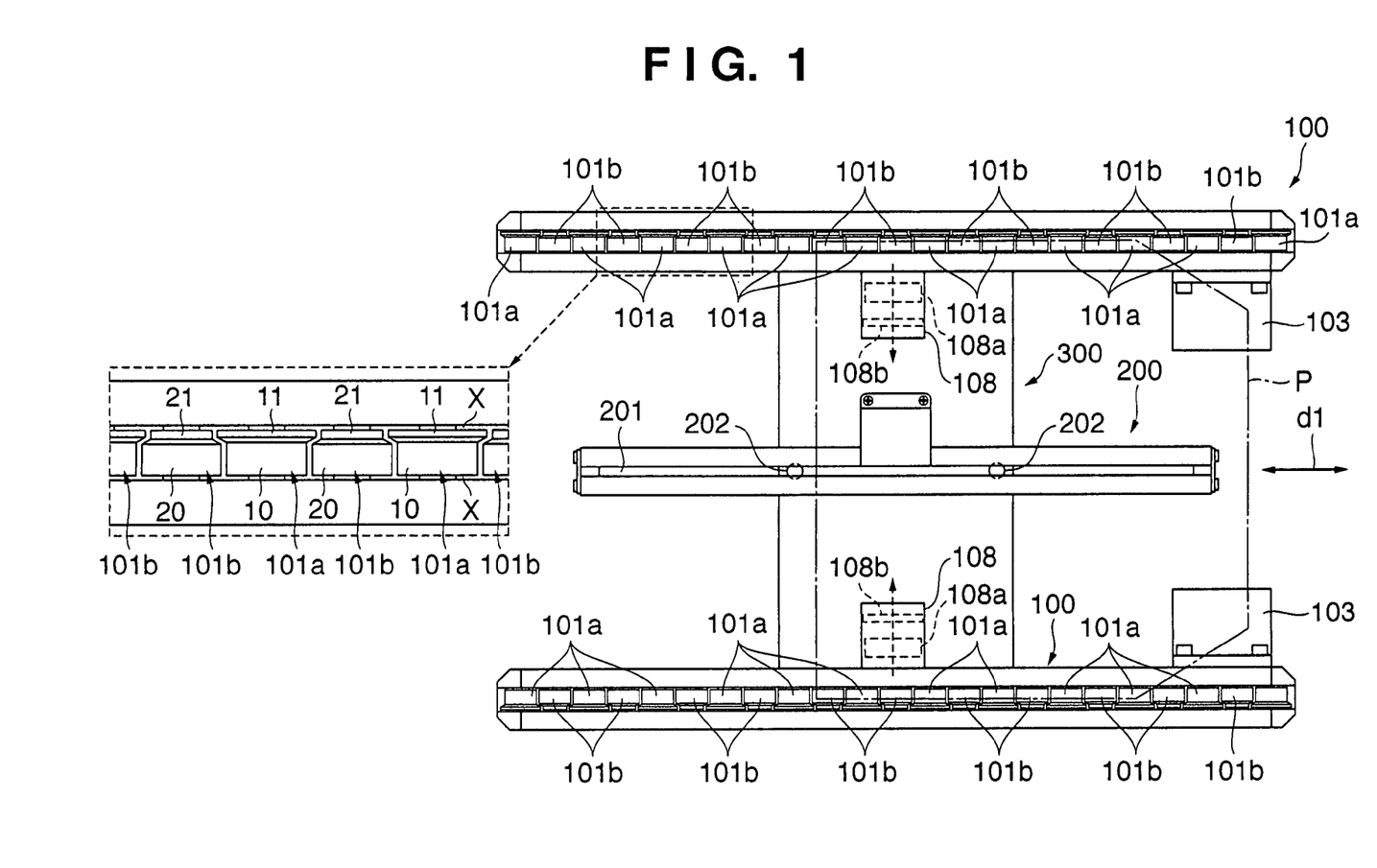
FIG. 1 is a plan view of a conveying apparatus A according to one embodiment of the present invention.
Figure 2:
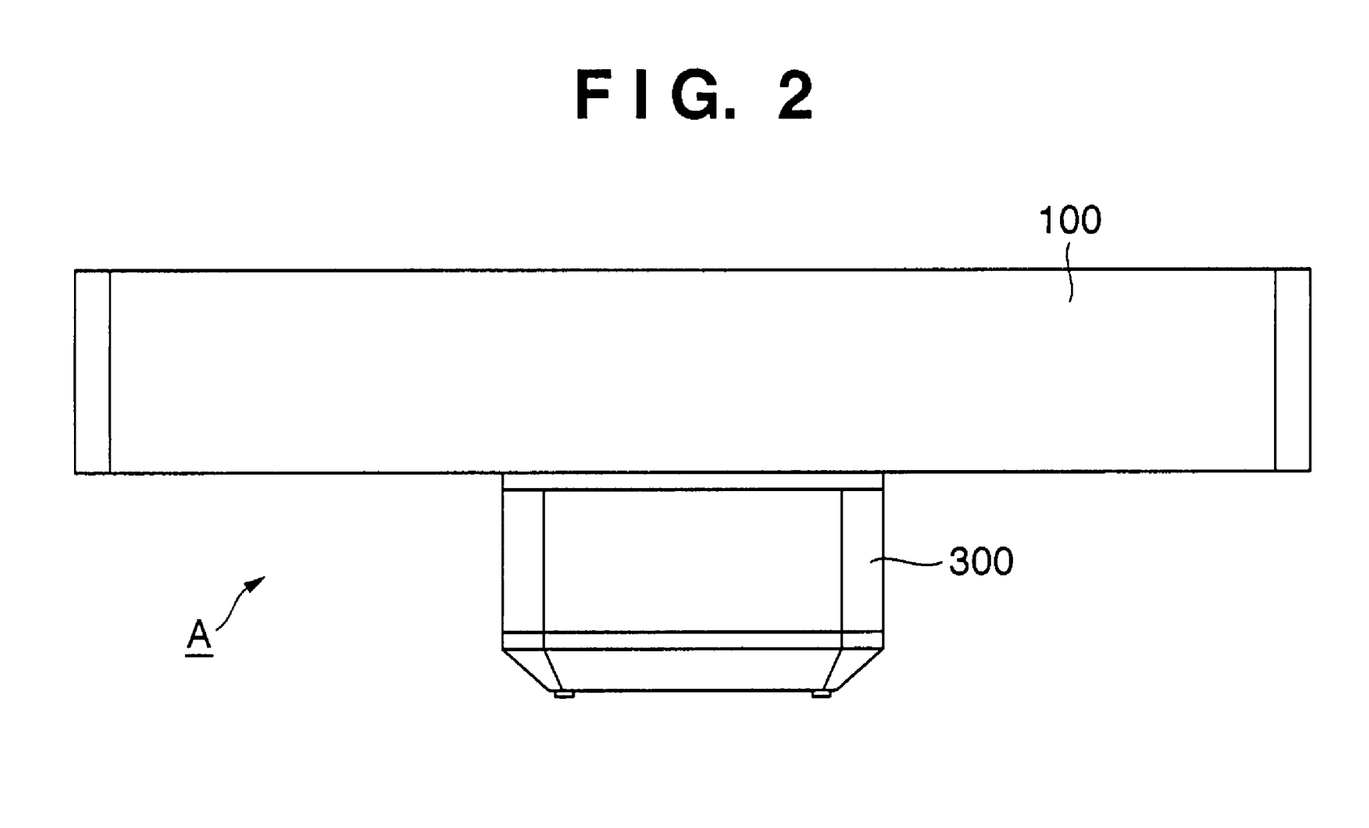
FIG. 2 is a front view of the conveying apparatus A.
Figure 3:
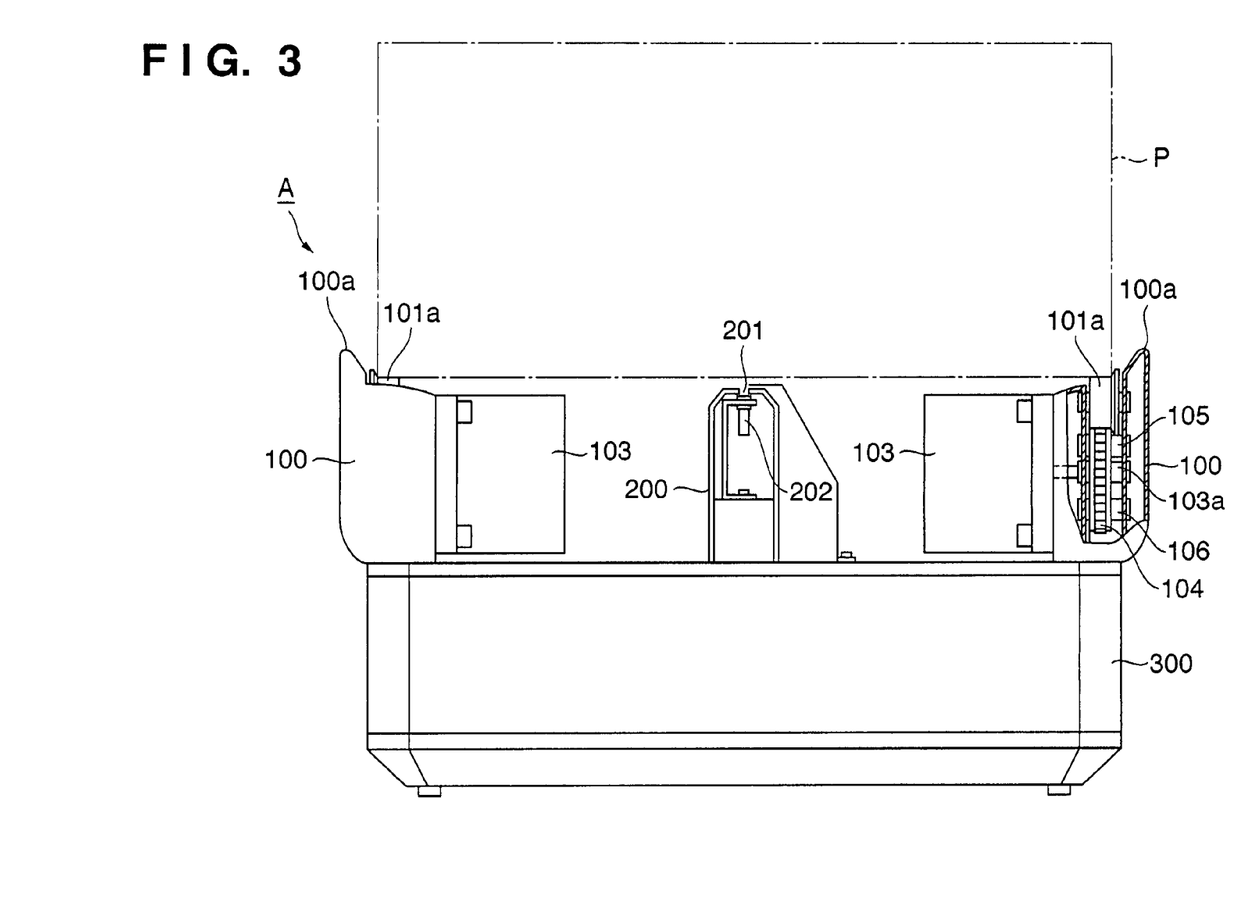
FIG. 3 is a (partially cutaway) right side view of the conveying apparatus A.

FIG. 1 is a plan view of a conveying apparatus A according to one embodiment of the present invention; FIG. 2 is a front view of the conveying apparatus A, and FIG. 3 is a (partially cutaway) right side view of the conveying apparatus A. The conveying apparatus A is a conveying apparatus that conveys a conveying target object P indicated by a broken line in the direction of an arrow d1 of FIG. 1. For example, the conveying target object P is a pod which accommodates a semiconductor wafer. The conveying apparatus A comprises two sets of support units 100, a sensor unit 200 which detects the conveying target object P as passing through it, and a base unit 300 which supports the support units 100 and sensor unit 200.

The respective support units 100 are arrayed in the conveying direction d1 and support a plurality of rollers 101a and 101b (to be referred to as rollers 101 hereinafter when employing a generic name) on which the conveying target object P is placed. Edges 100a of the support units 100 extend upward above the rollers 101, as shown in FIG. 3, to prevent the conveying target object P from falling off from the support units 100.

The rollers 101a and 101b alternate to be adjacent to each other. The plurality of rollers 101 are arrayed to form one straight line along the conveying direction d1. The respective support units 100 are arranged parallel to each other to be spaced apart from each other by a predetermined distance (a distance corresponding to the width of the conveying target object P) in a direction perpendicular to the conveying direction d1.

Figure 4A:
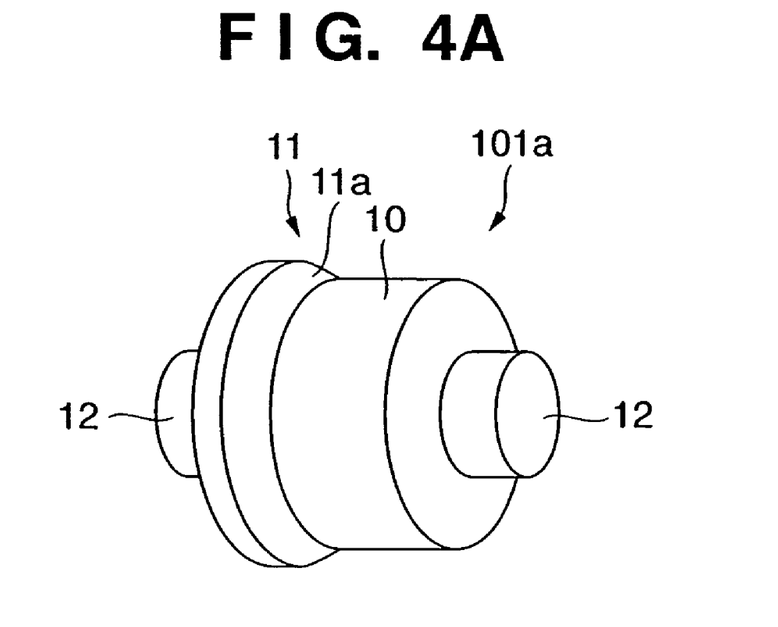
Figure 4B:
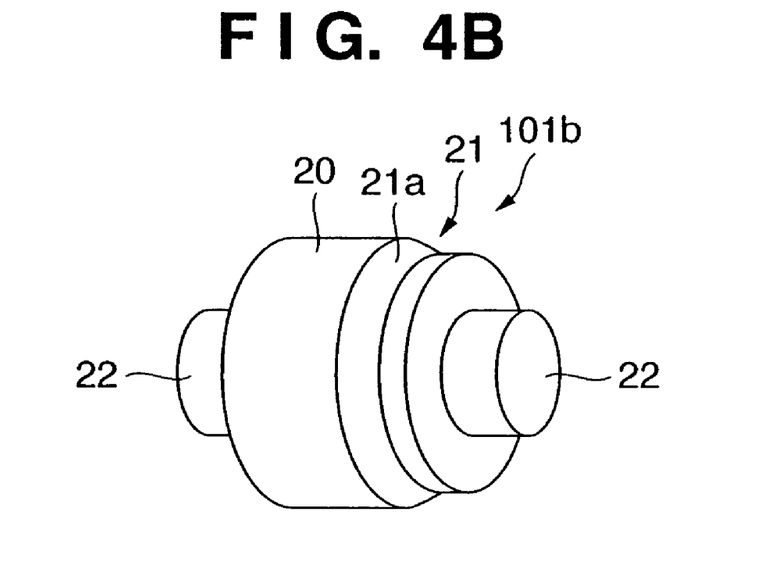
FIG. 4B is a view showing the outer appearance of a roller 101b.

The arrangement of the rollers 101a and 101b will be described with reference to FIG. 1 and FIGS. 4A and 4B. FIG. 4A is a view showing the outer appearance of the roller 101a, and FIG. 4B is a view showing the outer appearance of the roller 101b. The roller 101a has a placement portion 10 on which the conveying target object P is to be placed and which has a circular portion, a large diameter portion 11 which has a larger diameter than that of the placement portion 10, and a shaft portion 12. When the roller 101a rotates about the shaft portion 12, it conveys the conveying target object P placed on the placement portion 10. The large diameter portion 11 has a taper portion 11a the diameter of which gradually decreases toward the placement portion 10. The taper portion 11a guides the conveying target object P in the conveying direction d1. Namely, when the conveying target object P is to move to deviate from the conveying direction d1, the taper portion 11a regulates it to constantly locate it at the center between the respective support units 100. This prevents the conveying target object P from falling off from the rollers 101.

The roller 101b has a placement portion 20 on which the conveying target object P is to be placed and which has a circular portion, a small diameter portion 21 which has a smaller diameter than that of the placement portion 20, and a shaft portion 22. When the roller 101b rotates about the shaft portion 22, it conveys the conveying target object P placed on the placement portion 20. The small diameter portion 21 has a taper portion 21a the diameter of which gradually increases toward the placement portion 20. The taper portion 21a prevents interference between the large diameter portion 11 of the roller 101a and the roller 101b. Namely, the small diameter portion 21 of the roller 101b recesses by the projecting amount of the large diameter portion 11 of the roller 101a from the placement portion 10. This allows close noncontact arrangement of the rollers 101a and 101b as shown in FIG. 1. The noncontact arrangement of the rollers 101a and 101b can prevent their friction that might produce dust.

The close arrangement of the rollers 101a and 101b forms a seal that prevents dust from diffusing from between the rollers 101a and 101b. This suppresses contamination of the interior of the clean room where the conveying apparatus A is arranged. The gap between the rollers 101a and 101b is desirably set to several mm or less, and preferably 1 mm or less. If the degree of inclination of the taper portion 11a is substantially equal to that of the taper portion 21a, it can set the gap between the rollers 101a and 101b to be substantially uniform in the radial direction.

According to this embodiment, the placement portions 10 and 20 have the same diameter, and the rollers 101a and 101b are rotated at the same rotational speed. This can prevent slippage between the conveying target object P and the rollers 101a and 101b to produce dust. According to this embodiment, the rollers 101a and 101b have the same width. This can uniform and minimize a gap X (see FIG. 1) between the end face of each roller 101 and the corresponding support unit 100, and can also prevent the dust from diffusing from the gap X. An elastic layer made of rubber, a resin, or the like is preferably formed on the outer surface of each roller 101. This can decrease the slippage between the conveying target object P and the corresponding roller 101 and further decrease the vertical vibration of the conveying target object P.

Figure 4C:
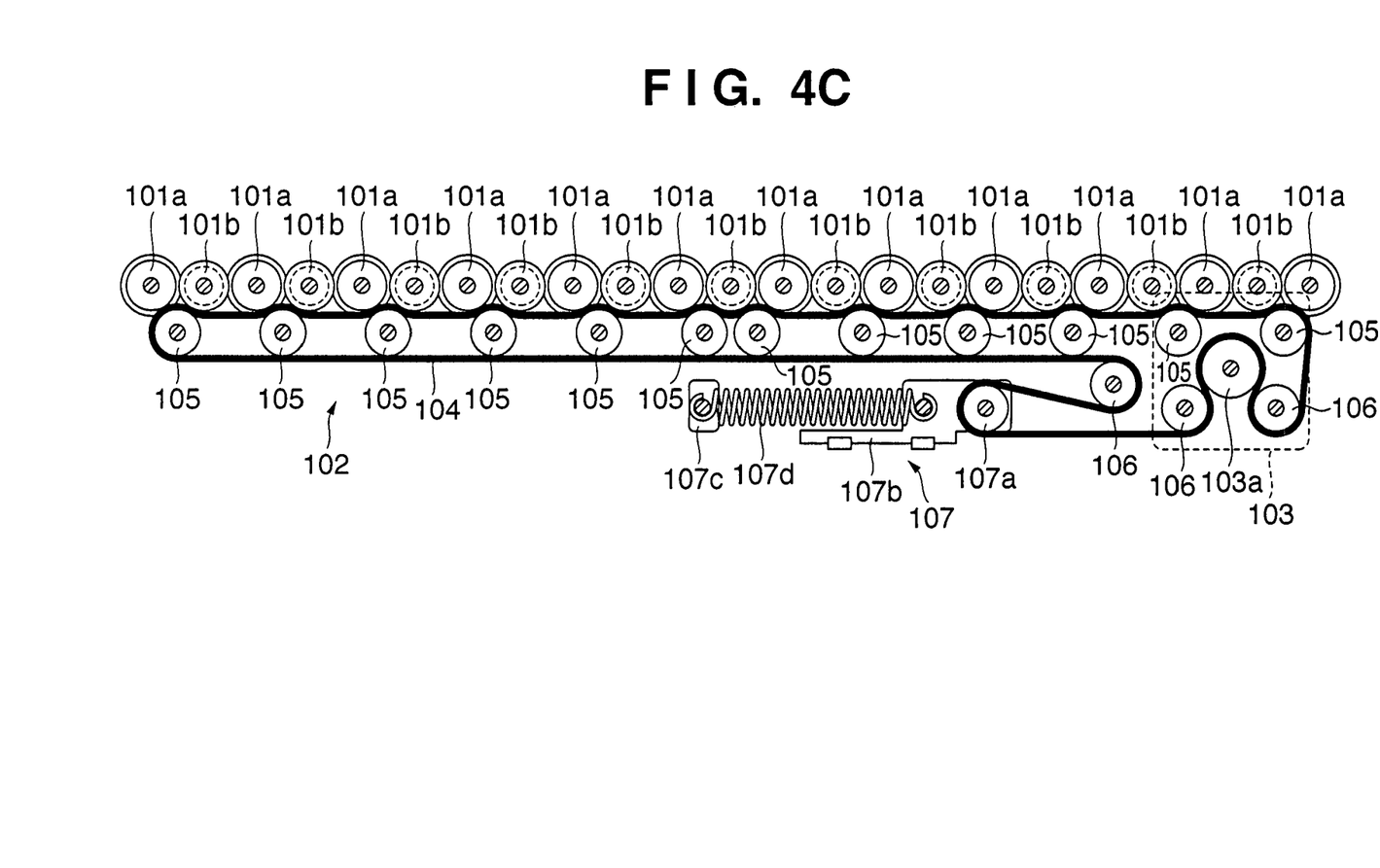
FIG. 4C is a schematic view of a driving mechanism 102 which applies a rotation force to respective rollers 101.

A driving mechanism which applies a rotation force to the respective rollers 101 will be described with reference to FIGS. 4C and 3. FIG. 4C is a schematic view of a driving mechanism 102 which applies a rotation force to the respective rollers 101. The driving mechanism 102 is actuated by the driving force of a motor 103 and accommodated in the support unit 100. Although the driving mechanism 102 applies the rotation force to all the rollers 101, it may apply the rotation force to only one roller. If the driving mechanism 102 applies the rotation force to all the rollers 101, the conveying force for the conveying target object P can be set always constant.

In the case of this embodiment, the driving mechanism 102 forms a belt transmission mechanism, and comprises an endless belt 104 which is arranged under the respective rollers 101 and comes into contact with the placement sections 10 and 20, a plurality of auxiliary rollers 105 which prevent slack of the endless belt 104 and press the endless belt 104 against the placement sections 10 and 20, and auxiliary rollers 106. The endless belt 104 is disposed to travel within the widths of the respective rollers 101 along a vertical plane. In the case of this embodiment, a flat belt is employed as the endless belt 104. The flat belt can decrease dust more than a case wherein a toothed belt is employed. With the flat belt, even if the rollers 101 and auxiliary rollers 105 bite a foreign substance, a slippage occurs among the rollers 101, auxiliary rollers 105, and the flat belt, so the breakage and the like of the apparatus can be minimized.

The endless belt 104 travels as a driving roller 103a mounted on the output shaft of the motor 103 applies a rotation force to it. The motor 103 is fixed to the inner side surface of the support unit 100, and a control unit (not shown) controls the motor 103. According to this embodiment, at least one auxiliary roller 105 is assigned to one set of rollers 101a and 101b. This can allow transmission of the rotation force to all the rollers 101 substantially constantly.

The driving mechanism 102 comprises a tension adjusting mechanism 107 which is arranged under the rollers 101 to adjust the tension of the endless belt 104. The tension adjusting mechanism 107 comprises a tension roller 107a around which the endless belt 104 is wound, a movable plate 107b which supports the tension roller 107a, and a spring 107d which extends between the movable plate 107b and a fixing portion 107c. The fixing portion 107c is fixed to the support unit 100. The movable plate 107b is movable with respect to the support unit 100 through a rail 107e. When the spring 107d pulls the tension roller 107a, the tension of the endless belt 104 is always maintained at a predetermined value. The tension adjusting mechanism 107 maintains the rotation force to be transmitted to the respective rollers 101 at a predetermined value.

According to this embodiment, the auxiliary rollers 105 and 106, driving roller 103a, and tension adjusting mechanism 107 are all arranged under the rollers 101, and have widths equal to or narrower than that of the rollers 101. In other words, when these rollers are arranged vertically, the width of the support unit 100 can be decreased to economize the installation space. Furthermore, disorder of a downflow air current can be prevented to maintain the cleanness in the clean room. Although the motors 103 project to the sides of the support units 100, as they project between the two support units 100, they do not adversely affect the installation space. As the belt transmission mechanism rotatably drives the respective rollers 101, the widths and sizes of the rollers can be minimized to further economize the installation space.

Referring back to FIG. 1, a cleaning unit 108 which cleans air in the support unit 100 and discharges the air to the outside is attached to the inner side surface of each support unit 100. According to this embodiment, the cleaning unit 108 comprises a fan motor 108a which draws air in the support unit 100 by suction, and a filter 108b which cleans air to be discharged to the outside by the fan motor 108a. The support unit 100 forms a substantially hollow surrounding body. Only the central portion of the upper surface of the support unit 100 is open along the conveying direction d1 to expose only the upper portions of the respective rollers 101. When the fan motor 108a actuates, it discharges air in the support unit 100. Although the cleaning unit 108 is not an indispensable constituent component, if it is provided, it can prevent dust generated in the support unit 100 from scattering in the clean room, so that the cleanness in the clean room can be maintained.

Referring to FIGS. 1 and 3, a sensor unit 200 has a slit 201, at the central portion of its upper surface, which is opened along a conveying direction d1. A plurality of sensors 202 are arranged under the slit 201 along the conveying direction d1. For example, the sensor 202 is an optical sensor and detects the conveying target object P as passing above it. The position of each conveying target object P can be detected on the basis of the detection results of the sensors 202.

Figure 5:
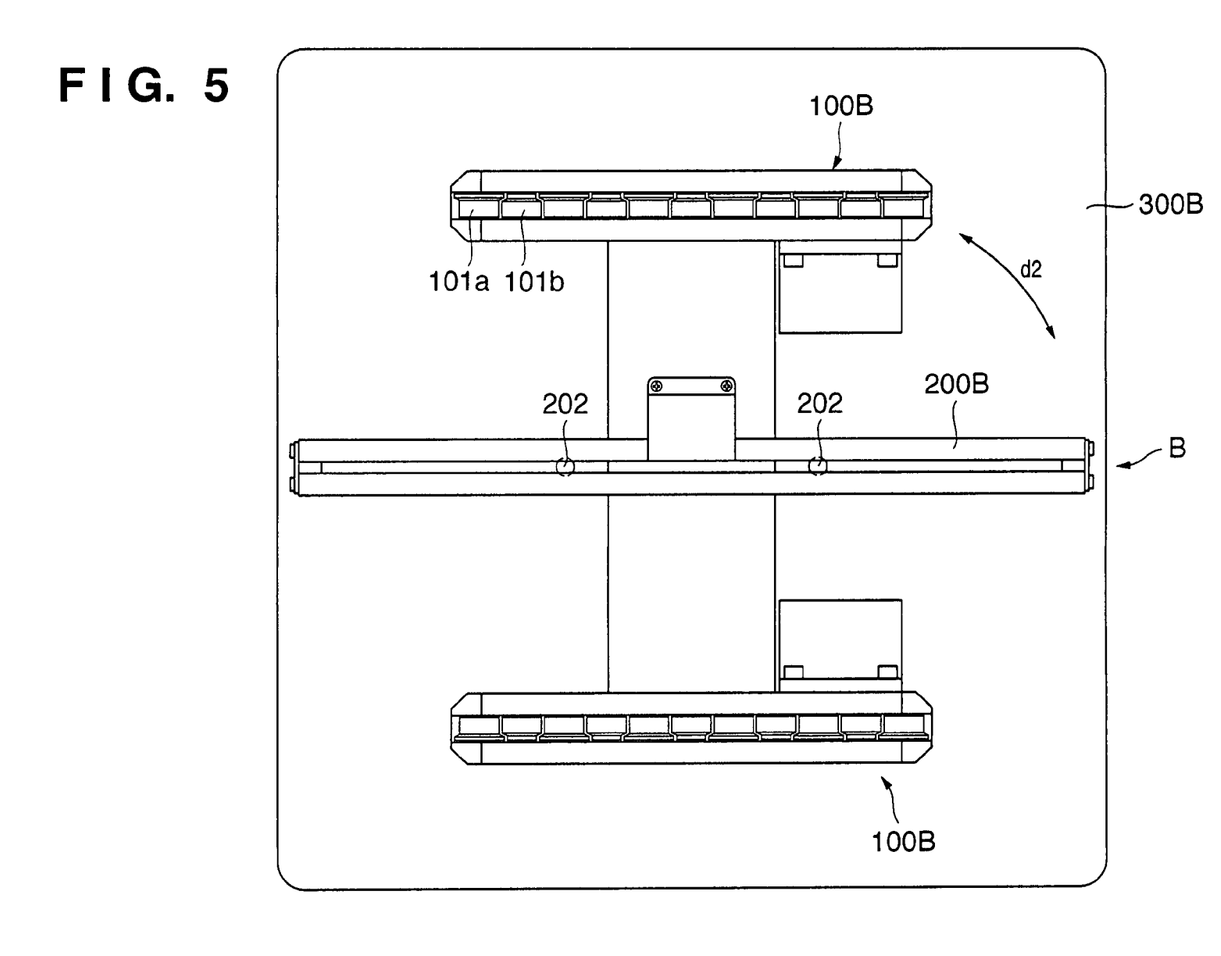
FIG. 5 is a plan view of a conveying apparatus B according to another embodiment of the present invention.
Figure 6:
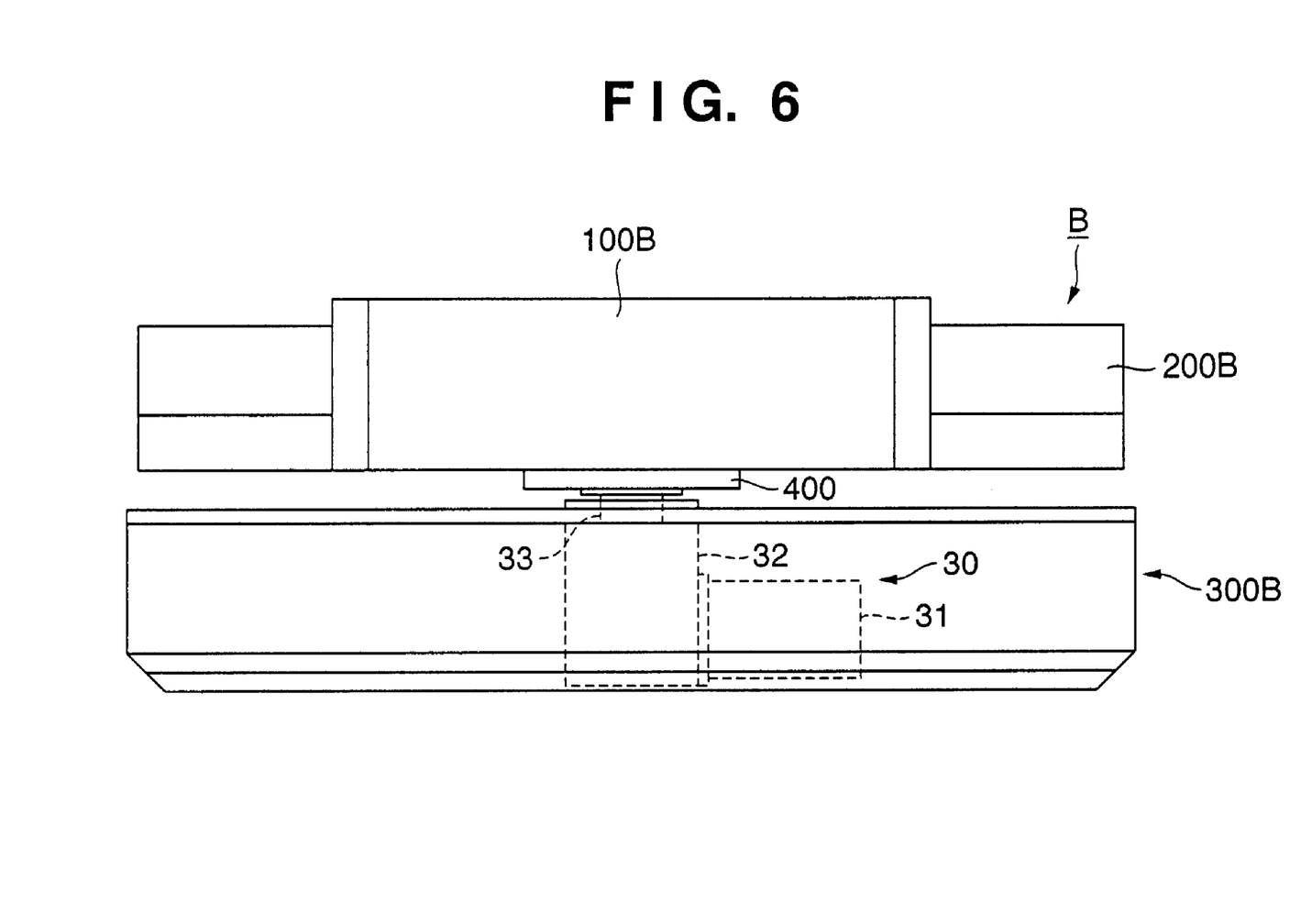
FIG. 6 is a front view of the conveying apparatus B.

A modification of the conveying apparatus A will be described. FIG. 5 is a plan view of a conveying apparatus B according to another embodiment of the present invention, and FIG. 6 is a front view of the conveying apparatus B. The conveying apparatus B comprises two sets of support units 100B, a sensor unit 200B which detects a conveying target object P as passing through it, a table 400 which supports the support units 100B and sensor unit 200B, and a base unit 300B. Each support unit 100B has the same arrangement as that of the support unit 100 described above, and has rollers 101 which are different in number from the rollers of the support unit 100. Although the support unit 100B does not have a cleaning unit 108, it may have one. The sensor unit 200B has the same arrangement as that of the sensor unit 200 described above.

In the conveying apparatus B, a rotating mechanism 30 which pivots the table 400 about a vertical axis is provided to the base unit 300. The rotating mechanism 30 comprises a power source 31 such as a motor, a rotating shaft 33, and a transmission mechanism portion 32 such as a gear box which transmits the driving force from the power source 31 to the rotating shaft 33. The upper end of the rotating shaft 33 is connected to the lower surface of the table 400.

Figure 7:
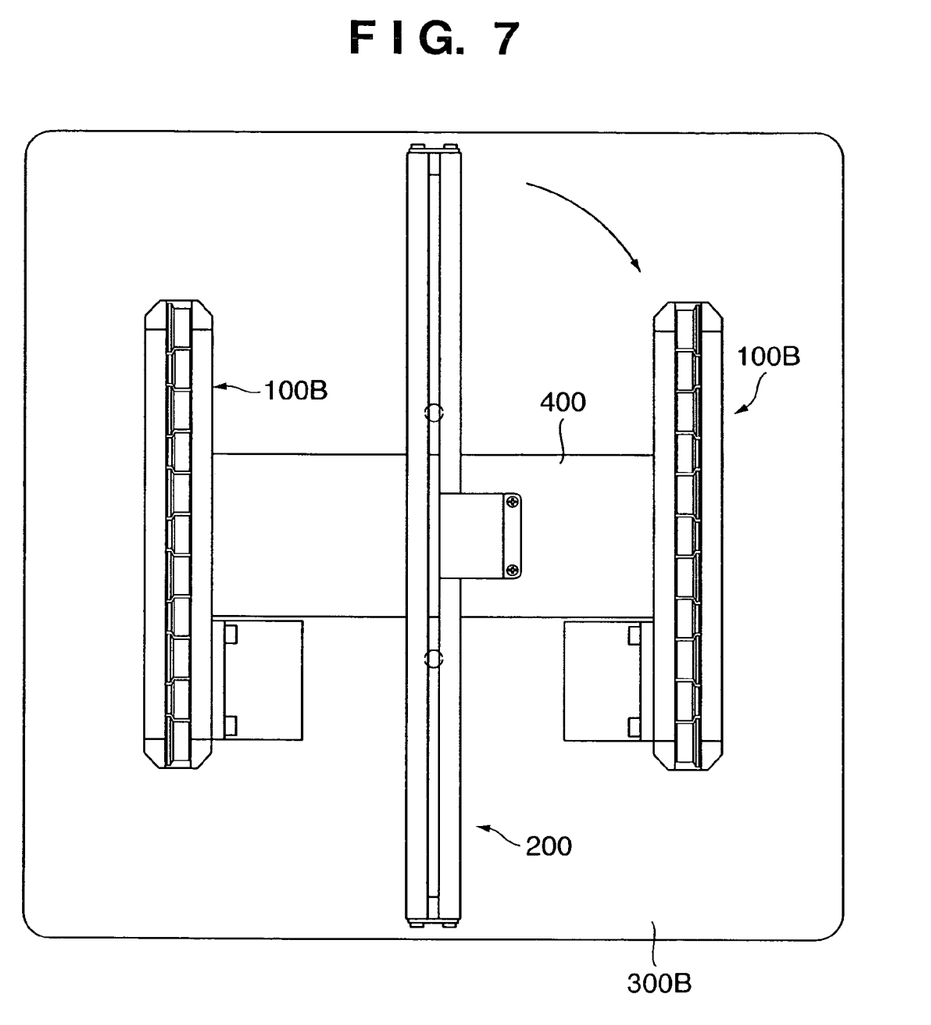
FIG. 7 is a view showing a state of the conveying apparatus B wherein a table 400 is pivoted by an angle of 90° from the state of FIG. 5.

When the table 400 is rotated by rotating the rotating shaft 33, it can pivot the support units 100B and sensor unit 200B mounted on the table 400 as indicated by an arrow d2. FIG. 7 is a view showing a state wherein the table 400 is pivoted by an angle of 90° from the state of FIG. 5. The conveying apparatus B can be used as a conveying apparatus that relays conveying apparatuses A having different conveying directions.

Figure 8:
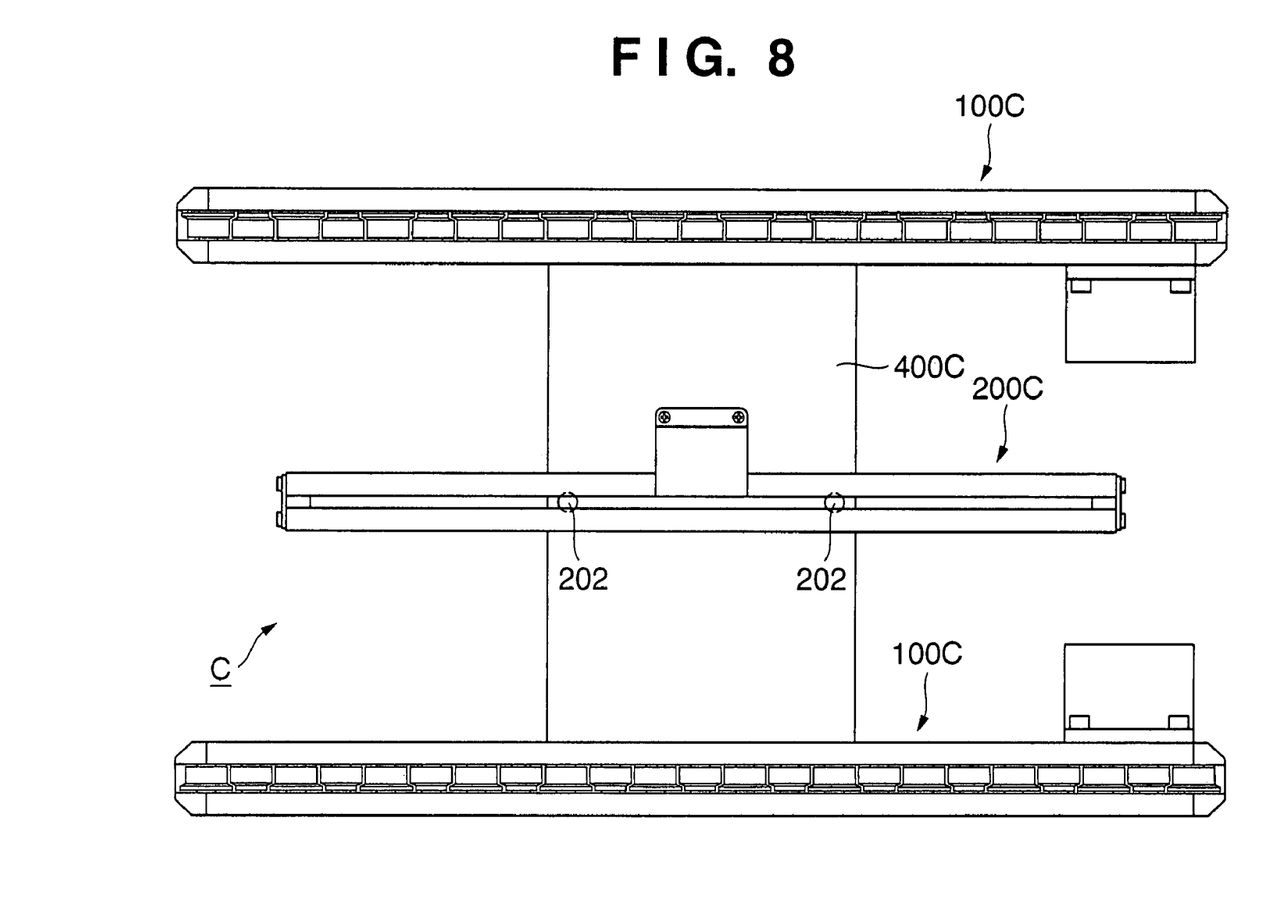
FIG. 8 is a plan view of a conveying apparatus C according to still another embodiment of the present invention.
Figure 9:
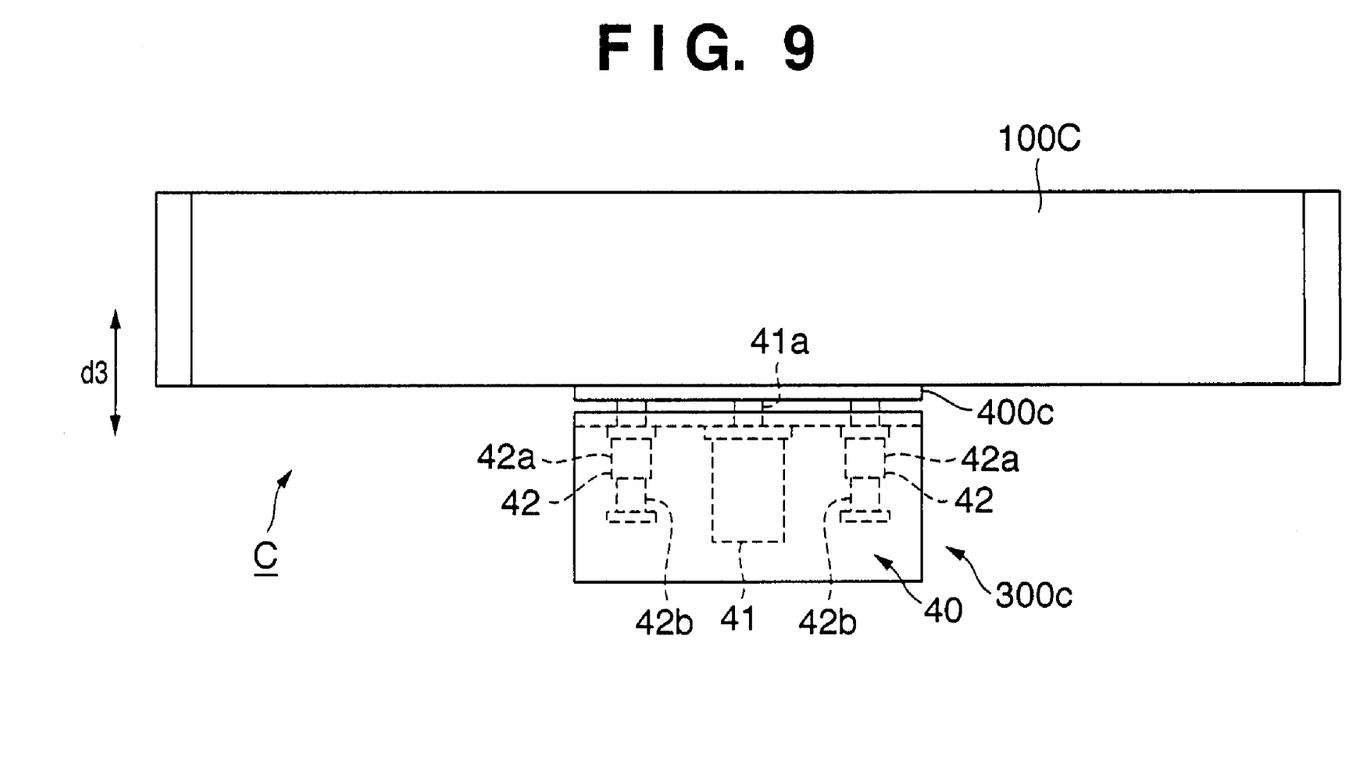
FIG. 9 is a front view of the conveying apparatus C.

Another modification of the conveying apparatus A will be described. FIG. 8 is a plan view of a conveying apparatus C according to still another embodiment of the present invention, and FIG. 9 is a front view of the conveying apparatus C. The conveying apparatus C comprises two sets of support units 100C, a sensor unit 200C which detects a conveying target object P as passing through it, a table 400C which supports the support units 100C and sensor unit 200C, and a base unit 300C. Each support unit 100C has the same arrangement as that of the support unit 100 described above. Although the support unit 100C does not have a cleaning unit 108, it may have one. The sensor unit 200C has the same arrangement as that of the sensor unit 200 described above, but its entire length is different from that of the sensor unit 200.

Figure 10:
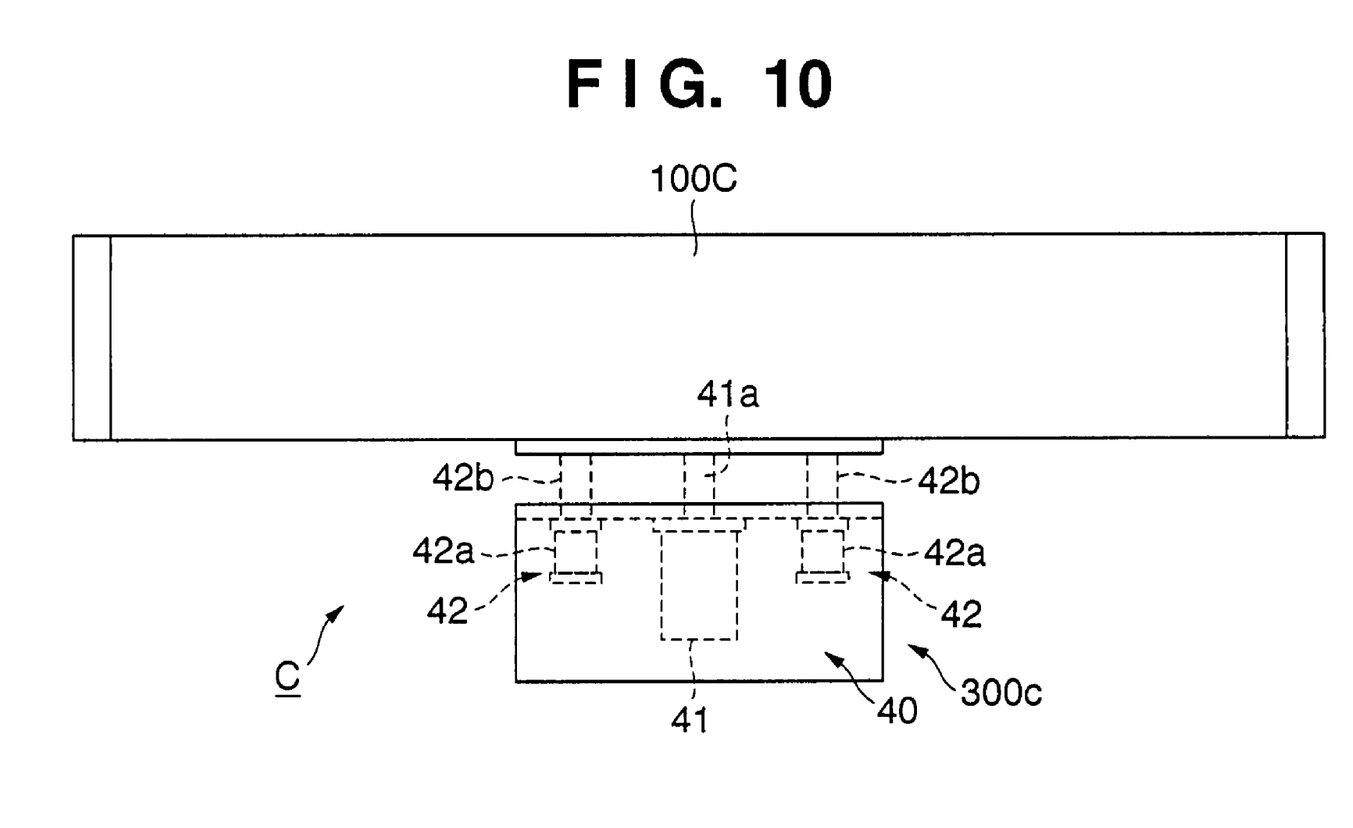
FIG. 10 is a view showing a state of the conveying apparatus C wherein a table 400C is moved upward from the state of FIG. 9.

In the conveying apparatus C, an elevating mechanism 40 which moves the table 400C vertically (an arrow d3) is provided to the base unit 300C. The elevating mechanism 40 is provided with an actuator 41 which vertically moves the table 400C, and a plurality of auxiliary guides 42. A rod portion 41a at the distal end of the actuator 41 connects to the lower surface of the table 400C. The rod portion 41a contracts from the main body of the actuator 41 to move the table 400C vertically. Each auxiliary guide 42 comprises a cylinder 42a and a rod 42b which vertically moves along the cylinder 42a. The upper end of the rod 42b connects to the table 400C to aid vertical movement of the table 400C. FIG. 10 is a view showing a state wherein the table 400C is moved upward from the state of FIG. 9. The conveying apparatus C can be used as a conveying apparatus that relays conveying apparatuses A which are disposed to have different conveying heights.

Figure 11:
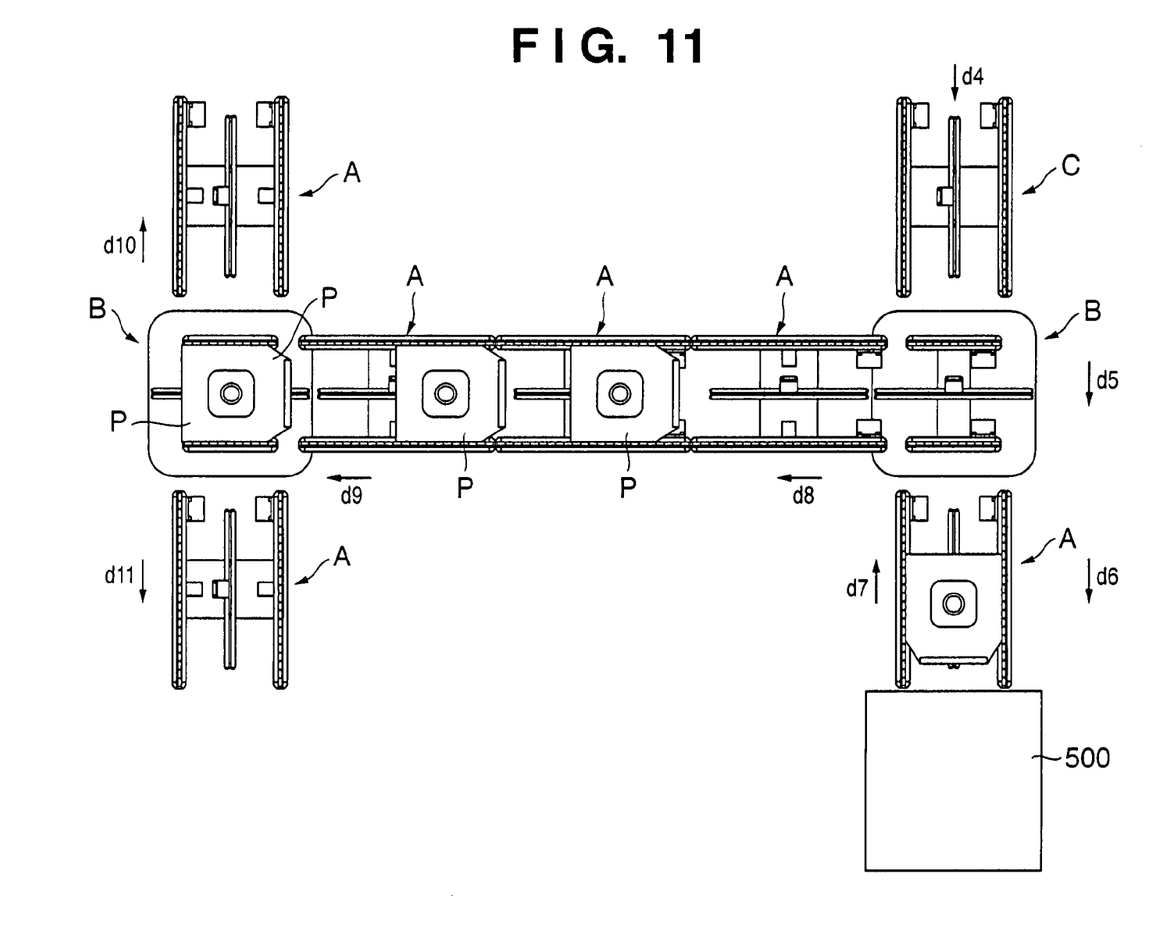
FIG. 11 is a view showing a layout of a conveying system that uses the conveying apparatuses A to C.

A conveying system which uses the conveying apparatuses A to C will be described. FIG. 11 is a view showing a layout of the conveying system that uses the conveying apparatuses A to C. In the example of FIG. 11, the three conveying apparatuses A are arranged in series at the center, and the conveying apparatuses B are arranged at the two ends of the serial row of the conveying apparatuses A. A conveying apparatus A or C is arranged next to each conveying apparatus B such that its conveying direction is perpendicular to the three conveying apparatuses A at the center.

In this conveying system, for example, a conveying target object P is conveyed from the system of a previous stage (not shown) to the conveying apparatus C (arrow d4). The conveying apparatus C is used expecting a case wherein the convey direction is different between the system of the previous stage and the conveying system of FIG. 11. The conveying target object P passes through the conveying apparatuses B and A as indicated by, e.g., arrows d5 and d6, to reach a processing device 500. For example, when the conveying target object P is a pod that accommodates a semiconductor wafer, the processing device 400 processes the accommodated semiconductor wafer.

When the process by the processing device 500 ends, the conveying apparatus B changes the conveying direction as indicated by arrows d7 and d8, and the conveying target object P passes through the three conveying apparatuses A at the center. After that, the conveying apparatus B changes the convey direction as indicated by an arrow d9. The conveying target object P is distributed in either of directions indicated by arrows d10 and d11 and is conveyed to the system of the next stage. Combinations of the conveying apparatuses A to C in this manner can construct various types of conveying systems.

The invention claimed is:

1. A conveying apparatus comprising a plurality of rollers which are arranged in a conveying direction of a conveying target object and on which the conveying target object is to be placed, wherein said plurality of rollers include a first roller and a second roller adjacent to said first roller, said first roller comprises a first placement portion on which the conveying target object is to be placed, and a large diameter portion which has a larger diameter than that of said first placement portion and guides the conveying target object in the conveying direction, and said second roller comprises a second placement portion on which the conveying target object is to be placed, a small diameter portion which has a smaller diameter than that of said second placement portion and prevents interference between said large diameter portion and said second roller, and a gap between said first roller and said second roller is substantially uniform in a radial direction of said first and second rollers.

2. The conveying apparatus according to claim 1, wherein said first roller and said second roller arranged closely to be in noncontact with each other.

3. The conveying apparatus according to claim 1, wherein said first placement portion and said second placement portion have the same diameter.

4. The conveying apparatus according to claim 1, wherein said plurality of rollers comprise said first roller and said second roller that are alternately arranged.

5. The conveying apparatus according to claim 1, wherein said plurality of rollers are provided in two rows at a predetermined distance therebetween along the conveying direction.

6. The conveying apparatus according to claim 1, further comprising driving means for applying a rotation force to said first and second rollers.

7. The conveying apparatus according to claim 6, wherein said driving means comprises
- an endless belt which is disposed under said first and second rollers and is in contact with said first and second placement sections, and
- an auxiliary roller which presses said endless belt against said first and second placement sections.

8. The conveying apparatus according to claim 7, wherein said endless belt is disposed to travel along a vertical plane, and
said driving means further comprises
- a driving roller which is arranged under said first and second rollers and causes said endless belt to travel.

9. The conveying apparatus according to claim 8, wherein said driving means further comprises a tension adjusting mechanism which is arranged under said first and second rollers and adjusts a tension of said endless belt.

10. The conveying apparatus according to claim 6, further comprising a support section which rotatably supports said plurality of rollers and stores and supports said driving means.

11. The conveying apparatus according to claim 10, further comprising
cleaning means for cleaning air in said support section and discharging the air Outside.

12. The conveying apparatus according to claim 10, further comprising pivoting means for pivoting said support section about a vertical axis.

13. The conveying apparatus according to claim 10, further comprising elevating means for vertically moving said support section.

14. The conveying apparatus according to claim 1 further comprising a support section which rotatably supports said plurality of rollers,
wherein said support section forms a substantially hollow surrounding body having an upper surface which is open along the conveying direction to expose only upper portions of said plurality of rollers.

* * * * *